US 12,490,515 B2

(12) United States Patent
Yin et al.

(10) Patent No.: US 12,490,515 B2
(45) Date of Patent: Dec. 2, 2025

(54) LIGHT-EMITTING SUBSTRATE AND METHOD FOR MANUFACTURING THE SAME, BACKLIGHT MODULE AND DISPLAY DEVICE

(71) Applicants: Hefei BOE Ruisheng Technology Co., Ltd., Anhui (CN); BOE TECHNOLOGY GROUP CO., LTD., Beijing (CN)

(72) Inventors: Li Yin, Beijing (CN); Zhi Zhang, Beijing (CN); Yajun Ma, Beijing (CN); Zhenzhong Fang, Beijing (CN); Penghua Wang, Beijing (CN); Bisheng Li, Beijing (CN)

(73) Assignees: HEFEI BOE RUISHENG TECHNOLOGY CO., LTD., Anhui (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 18/015,143

(22) PCT Filed: Feb. 25, 2022

(86) PCT No.: PCT/CN2022/078049
§ 371 (c)(1),
(2) Date: Jan. 9, 2023

(87) PCT Pub. No.: WO2023/159500
PCT Pub. Date: Aug. 31, 2023

(65) Prior Publication Data
US 2024/0243140 A1 Jul. 18, 2024

(51) Int. Cl.
*H10D 86/60* (2025.01)
*H01L 25/16* (2023.01)
(Continued)

(52) U.S. Cl.
CPC .......... *H10D 86/60* (2025.01); *H01L 25/167* (2013.01); *H10D 86/021* (2025.01); *H10D 86/443* (2025.01); *H10D 86/451* (2025.01)

(58) Field of Classification Search
CPC .......................... H10D 86/60; H10D 86/021
See application file for complete search history.

(56) References Cited

U.S. PATENT DOCUMENTS

2005/0082685 A1  4/2005  Bojkov et al.
2006/0060970 A1  3/2006  Jeong et al.
(Continued)

FOREIGN PATENT DOCUMENTS

CN  109597245 A  4/2019
CN  110235242 A  9/2019
(Continued)

*Primary Examiner* — Joseph L Williams
(74) *Attorney, Agent, or Firm* — XSENSUS LLP

(57) ABSTRACT

A light-emitting substrate includes a substrate, and a first conductive layer, a passivation layer and a first protective pattern that are disposed on the substrate sequentially. The first conductive layer includes a plurality of pad groups each including a plurality of pads. The passivation layer is provided with a plurality of openings therein, an opening is located on a side of a pad away from the substrate, and the opening and an edge of the pad have a distance therebetween. The passivation layer includes a first climbing portion covering a sidewall of a first edge of the pad and a second climbing portion covering a sidewall of a second edge of the pad. The first protective pattern covers the first climbing portion and extends to a side of the passivation layer away from the pad, and the first protective pattern and the opening have a distance therebetween.

20 Claims, 7 Drawing Sheets

(51) Int. Cl.
  *H10D 86/01*  (2025.01)
  *H10D 86/40*  (2025.01)

(56) References Cited

U.S. PATENT DOCUMENTS

| | | | |
|---|---|---|---|
| 2012/0241793 A1* | 9/2012 | In | H10H 20/8506 |
| | | | 438/22 |
| 2020/0243461 A1* | 7/2020 | Chiang | H01L 24/19 |
| 2021/0050555 A1 | 2/2021 | Lee et al. | |
| 2021/0212212 A1 | 7/2021 | Chen | |
| 2021/0223631 A1 | 7/2021 | Ban et al. | |

FOREIGN PATENT DOCUMENTS

| | | | |
|---|---|---|---|
| CN | 112259564 A | | 1/2021 |
| CN | 112397546 A | | 2/2021 |
| JP | 2012-146720 A | | 8/2012 |
| KR | 91-0019265 A | | 11/1991 |

\* cited by examiner

LIGHT-EMITTING SUBSTRATE AND METHOD FOR MANUFACTURING THE SAME, BACKLIGHT MODULE AND DISPLAY DEVICE

CROSS-REFERENCE TO RELATED APPLICATION

This application is a national phase entry under 35 USC 371 of International Patent Application No. PCT/CN2022/078049, filed on Feb. 25, 2022, which is incorporated herein by reference in its entirety.

TECHNICAL FIELD

The present disclosure relates to the field of display technologies, and in particular, to a light-emitting substrate and a method for manufacturing the same, a backlight module and a display device.

BACKGROUND

With the development of light-emitting diode technologies, backlight sources using light-emitting diodes (LEDs) with sub-millimeter scale and even micro-meter scale have been widely used. Therefore, not only can a picture contrast of a transmissive display product using the backlight source reach a level of an organic light-emitting diode (OLED) display product, but also the product can retain the technical advantages of a liquid crystal display (LCD). As a result, the display effect of the picture may be improved, which may provide a good visual experience for users.

SUMMARY

In an aspect, a light-emitting substrate is provided. The light-emitting substrate includes a substrate, a first conductive layer, a passivation layer and a first protective pattern. The first conductive layer is disposed on a side of the substrate. The first conductive layer includes a plurality of pad groups, and each pad group includes a plurality of pads. The passivation layer is disposed on a side of the first conductive layer away from the substrate. The passivation layer is provided with a plurality of openings therein, an opening is located on a side of a pad away from the substrate, and the opening and an edge of the pad have a distance therebetween. The passivation layer includes a first climbing portion and a second climbing portion, the first climbing portion covers a sidewall of a first edge of the pad, and the second climbing portion covers a sidewall of a second edge of the pad. The first edge is one of edges where the plurality of pads in the pad group are proximate to one another, and the second edge is one of other edges of the plurality of pads in the pad group. The first protective pattern is disposed on a surface of the passivation layer away from the substrate. The first protective pattern covers the first climbing portion and extends to a side of the passivation layer away from the pad, and the first protective pattern and the opening have a distance therebetween.

In some embodiments, the light-emitting substrate further includes a second protective pattern disposed on the surface of the passivation layer away from the substrate. The second protective pattern covers the second climbing portion and extends to the side of the passivation layer away from the pad, and the second protective pattern and the opening have another distance therebetween.

In some embodiments, the light-emitting substrate further includes a third protective pattern disposed on the surface of the passivation layer away from the substrate and covering a target region, and the target region is a region other than regions where the plurality of pads, the first climbing portion and the second climbing portion are located.

In some embodiments, reflectivity of the first protective pattern is greater than or equal to 80%. The light-emitting substrate further includes a second protective pattern disposed on the surface of the passivation layer away from the substrate, the second protective pattern covers the second climbing portion and extends to the side of the passivation layer away from the pad, the second protective pattern and the opening have another distance therebetween, and reflectivity of the second protective pattern is greater than or equal to 80%. The light-emitting substrate further includes a third protective pattern disposed on the surface of the passivation layer away from the substrate and covering a target region, the target region is a region other than regions where the plurality of pads, the first climbing portion and the second climbing portion are located, and reflectivity of the third protective pattern is greater than or equal to 80%.

In some embodiments, a minimum distance between an edge of the opening and the edge of the pad is greater than or equal to 18 μm and less than 0.2 mm; alternatively, the minimum distance between the edge of the opening and the edge of the pad is greater than or equal to 0.2 mm.

In some embodiments, in a case where the minimum distance between the edge of the opening and the edge of the pad is greater than or equal to 18 μm and less than 0.2 mm, a material of the first protective pattern includes a photosensitive white ink. In a case where the minimum distance between the edge of the opening and the edge of the pad is greater than or equal to 0.2 mm, the material of the first protective pattern includes a non-photosensitive white ink.

In some embodiments, the light-emitting substrate further includes a second protective pattern disposed on the surface of the passivation layer away from the substrate and covering the second climbing portion, and a third protective pattern disposed on the surface of the passivation layer away from the substrate and covering a target region. The first protective pattern, the second protective pattern and the third protective pattern are made of the same material and disposed in the same layer.

In some embodiments, the plurality of pad groups include a driving pad group, and the driving pad group includes a first pad, a second pad, a third pad and a fourth pad. The first pad is configured to be connected to a first pin of a driving chip. The second pad is configured to be connected to a second pin of the driving chip. The third pad is configured to be connected to a third pin of the driving chip. The fourth pad is configured to be connected to a fourth pin of the driving chip.

In some embodiments, the light-emitting substrate further includes a second conductive layer and an insulating layer. The second conductive layer is disposed between the first conductive layer and the substrate. The second conductive layer includes a plurality of support patterns, and an orthogonal projection of each driving pad group on the substrate is at least partially overlapped with an orthogonal projection of a support pattern on the substrate. The insulating layer is disposed between the second conductive layer and the first conductive layer.

In some embodiments, each support pattern includes four support plates separated from one another. The four support plates are respectively disposed on a side of the first pad, the second pad, the third pad and the fourth pad, proximate to the substrate, in each driving pad group, and an orthogonal projection of the opening on the substrate is within an orthogonal projection of a support plate on the substrate.

In some embodiments, the plurality of pad groups include a light-emitting device pad group, and the light-emitting device pad group includes an anode pad and a cathode pad. The anode pad is configured to be connected to an anode of a light-emitting device, and the cathode pad is configured to be connected to a cathode of the light-emitting device.

In some embodiments, a distance between first edges of the plurality of pads in each pad group is greater than or equal to 10 μm.

In some embodiments, the light-emitting substrate further includes a welding pattern disposed on a surface of the first conductive layer away from the substrate and covering at least the opening.

In another aspect, a method for manufacturing a light-emitting substrate is provided. The method includes: forming a first conductive layer on a substrate, wherein the first conductive layer includes a plurality of pad groups, and each pad group includes a plurality of pads;

forming a passivation layer on a side of the first conductive layer away from the substrate, wherein the passivation layer is provided with a plurality of openings therein, an opening is located on a side of a pad away from the substrate, and the opening and an edge of the pad have a distance therebetween; the passivation layer includes a first climbing portion and a second climbing portion, the first climbing portion covers a sidewall of a first edge of the pad, and the second climbing portion covers a sidewall of a second edge of the pad; and the first edge is one of edges where the plurality of pads in the pad group are proximate to one another, and the second edge is one of other edges of the plurality of pads in the pad group; and forming a first protective pattern on a side of the passivation layer away from the substrate, wherein the first protective pattern covers the first climbing portion and extends to a side of the passivation layer away from the pad; and the first protective pattern and the opening have a distance therebetween.

In some embodiments, the method further includes forming a second protective pattern synchronously in a process of forming the first protective pattern on the side of the passivation layer away from the substrate. The second protective pattern covers the second climbing portion and extends to the side of the passivation layer away from the pad, and the second protective pattern and the opening have another distance therebetween.

In some embodiments, the method further includes forming a third protective pattern synchronously in a process of forming the first protective pattern on the side of the passivation layer away from the substrate. The third protective pattern covers a target region, and the target region is a region other than regions where the plurality of pads, the first climbing portion and the second climbing portion are located.

In some embodiments, a minimum distance between an edge of the opening and the edge of the pad is greater than or equal to 18 μm and less than 0.2 mm. Forming the first protective pattern on the side of the passivation layer away from the substrate includes: forming a protective film on the side of the passivation layer away from the substrate; and patterning the protective film by using a photolithography process to form the first protective pattern.

In some embodiments, a minimum distance between an edge of the opening and the edge of the pad is greater than or equal to 0.2 mm. Forming the first protective pattern on the side of the passivation layer away from the substrate includes: forming the first protective pattern by using a screen printing process.

In yet another aspect, a backlight module is provided. The backlight module includes the light-emitting substrate as described in any of the above embodiments.

In yet another aspect, a display device is provided. The display device includes a display panel and the backlight module, and the backlight module is disposed on a backlight surface of the display panel.

BRIEF DESCRIPTION OF THE DRAWINGS

In order to describe technical solutions in the present disclosure more clearly, accompanying drawings to be used in some embodiments of the present disclosure will be introduced briefly. However, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on an actual size of a product, an actual process of a method and an actual timing of a signal involved in the embodiments of the present disclosure.

DETAILED DESCRIPTION

Figure 1:
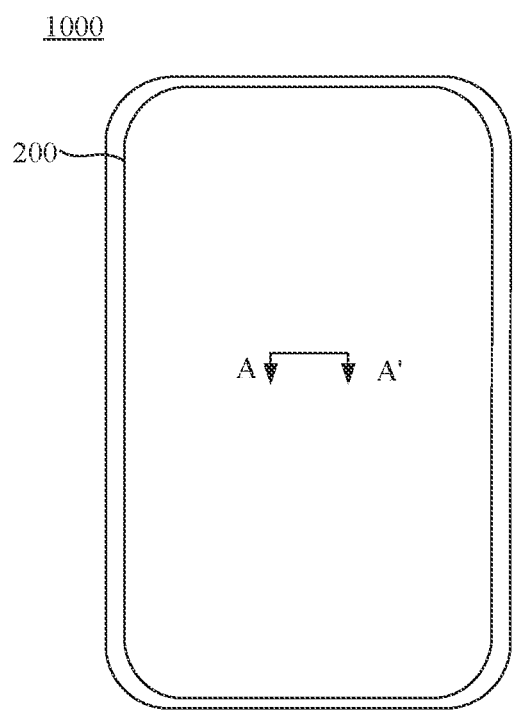
FIG. 1 is a structural diagram of a display device, in accordance with some embodiments.

Technical solutions in some embodiments of the present disclosure will be described clearly and completely in combination with accompanying drawings. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and claims, the term "comprise" and other forms thereof such as the third-person singular form "comprises" and the present participle form "comprising" are construed as an open and inclusive meaning, i.e., "included, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, terms such as "first" and "second" are only used for descriptive purposes, and are not to be construed as indicating or implying the relative importance or implicitly indicating the number of indicated technical features. Thus, features defined with "first" and "second" may explicitly or implicitly include one or more of the features. In the description of the embodiments of the present disclosure, the term "a plurality of" or "the plurality of" means two or more unless otherwise specified.

In the description of some embodiments, the terms "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The use of the phrase "applicable to" or "configured to" herein means an open and inclusive expression, which does not exclude devices that are applicable to or configured to perform additional tasks or steps.

In addition, the use of the phrase "based on" or "according to" is meant to be open and inclusive, since a process, step, calculation or other action that is "based on" or "according to" one or more of the stated conditions or values may, in practice, be based on or according to additional conditions or values exceeding those stated.

As used herein, the term such as "parallel", "perpendicular" or "equal" includes a stated condition and a condition similar to the stated condition, and the range of the similar condition is within an acceptable range of deviation. The acceptable range of deviation is determined by a person of ordinary skill in the art in consideration of measurement in question and errors associated with the measurement of a specific quantity (i.e., the limitations of the measurement system). For example, the term "parallel" includes absolute parallelism and approximate parallelism, and an acceptable range of deviation of the approximate parallelism may be a deviation within 5°; the term "perpendicular" includes absolute perpendicularity and approximate perpendicularity, and an acceptable range of deviation of the approximate perpendicularity may also be a deviation within 5°; the term "equal" includes absolute equality and approximate equality, and an acceptable range of deviation of the approximate equality may be a difference between two equals being less than or equal to 5% of either of the two equals.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Some embodiments of the present disclosure provide a display device 1000.

Referring to FIG. 1, the display device 1000 may be any device that displays images whether in motion (e.g., a video) or stationary (e.g., a still image), and regardless of text or image. For example, the display device 1000 may be any product or component having a display function, such as a television, a notebook computer, a tablet computer, a mobile phone, a personal digital assistant (PDA), a navigator, a wearable device, an augmented reality (AR) device, a virtual reality (VR) device.

Figure 2:
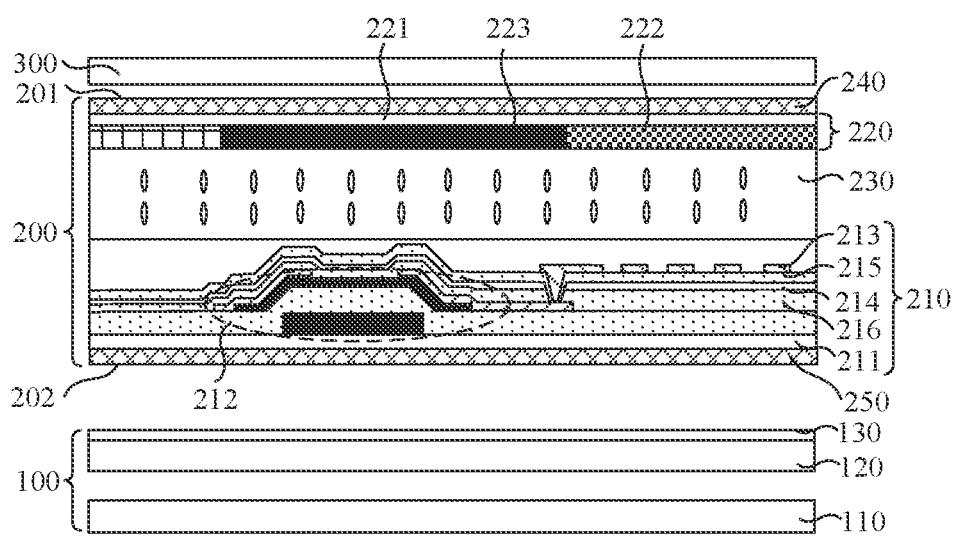
FIG. 2 is a sectional view taken along a section line A-A' in FIG. 1.

In some embodiments, the display device 1000 may be a liquid crystal display (LCD) device. Referring to FIG. 2, the display device 1000 may include a backlight module 100, a display panel 200 and a glass cover plate 300. The display panel 200 includes a light exit surface 201 and a backlight surface 202. The light exit surface refers to a surface of the display panel 200 for displaying a picture (an upper side of the display panel 200 in FIG. 2), and the backlight surface refers to the other surface opposite to the light exit surface. The backlight module 100 is disposed on the backlight surface of the display panel 200 (a lower side of the display panel 200 in FIG. 2), and the backlight module 100 is used for providing a light source for the display panel 200.

Referring to FIG. 2, the display panel 200 may include an array substrate 210, an opposite substrate 220, and a liquid crystal layer 230 disposed between the array substrate 210 and the opposite substrate 220.

Each sub-pixel in the array substrate 210 is provided with a thin film transistor (TFT) 212 and a pixel electrode 213 that are located on a first substrate 211. The thin film transistor 212 includes an active layer, a source, a drain, a gate and a gate insulating layer. The source and the drain are each in contact with the active layer, and the pixel electrode 213 is electrically connected to the drain of the thin film transistor 212.

In some embodiments, as shown in FIG. 2, the array substrate 210 further includes a common electrode 214 disposed on the first substrate 211. The pixel electrode 213 and the common electrode 214 may be disposed in different layers. In this case, as shown in FIG. 2, a first insulating layer 215 is provided between the pixel electrode 213 and the common electrode 214. In addition, in a case where the common electrode 214 is disposed between the thin film transistor 212 and the pixel electrode 213, as shown in FIG. 2, a second insulating layer 216 is further provided between the common electrode 214 and the thin film transistor 212. Here, the common electrode 214 may also be disposed in the opposite substrate 220, which is not limited herein.

It will be noted that the pixel electrode 213 and the common electrode 214 may be disposed in the same layer (not shown in the figures). In this case, the pixel electrode 213 and the common electrode 214 are each of a comb structure including a plurality of strip-shaped sub-electrodes.

In some embodiments, as shown in FIG. 2, the opposite substrate 220 may include a color filter layer 222 disposed on a second substrate 221. In this case, the opposite substrate 220 may also be referred to as a color filter (CF) substrate. The color filter layer 222 includes at least a red photoresist unit, a green photoresist unit and a blue photoresist unit, which are directly opposite to the sub-pixels in the array substrate 210, respectively. The opposite substrate 220 further includes a black matrix pattern 223 disposed on the second substrate 221. The black matrix pattern 223 is used for spacing apart the red photoresist unit, the green photoresist unit and the blue photoresist unit.

In some embodiments, as shown in FIG. 2, the display panel (e.g., a liquid crystal display panel) 200 may further include a first polarizer 240 disposed on a side of the opposite substrate 220 away from the liquid crystal layer 230, and a second polarizer 250 disposed on a side of the array substrate 210 away from the liquid crystal layer 230.

As shown in FIG. 2, the backlight module 100 may include a light-emitting substrate 110. The light-emitting substrate 110 may emit white light directly, and the white light is emitted to the display panel 200 after a light uniformizing treatment. Alternatively, the light-emitting substrate 110 may emit light of another color, and then the light is emitted to the display panel 200 after color conversion and a light uniformizing treatment.

For example, referring to FIG. 2, the light-emitting substrate 110 emits blue light. The backlight module 100 further includes a quantum dot film 120, and the quantum dot film 120 may include a red quantum dot material, a green quantum dot material and a transparent material. The blue light emitted by the light-emitting substrate 110 is converted into red light when passing through the red quantum dot material, is converted into green light when passing through the green quantum dot material, and does not convert color when passing through the transparent material. Then, the blue light, the red light and the green light are mixed and superimposed in a certain proportion to appear as white light.

In some embodiments, as shown in FIG. 2, the backlight module 100 further includes an optical film 130, which may include a diffuser plate and/or an optical brightness enhancing film. The diffuser plate is capable of mixing white light uniformly, and the optical brightness enhancing film is capable of enhancing light exit efficiency of the backlight module 100.

Figure 3:
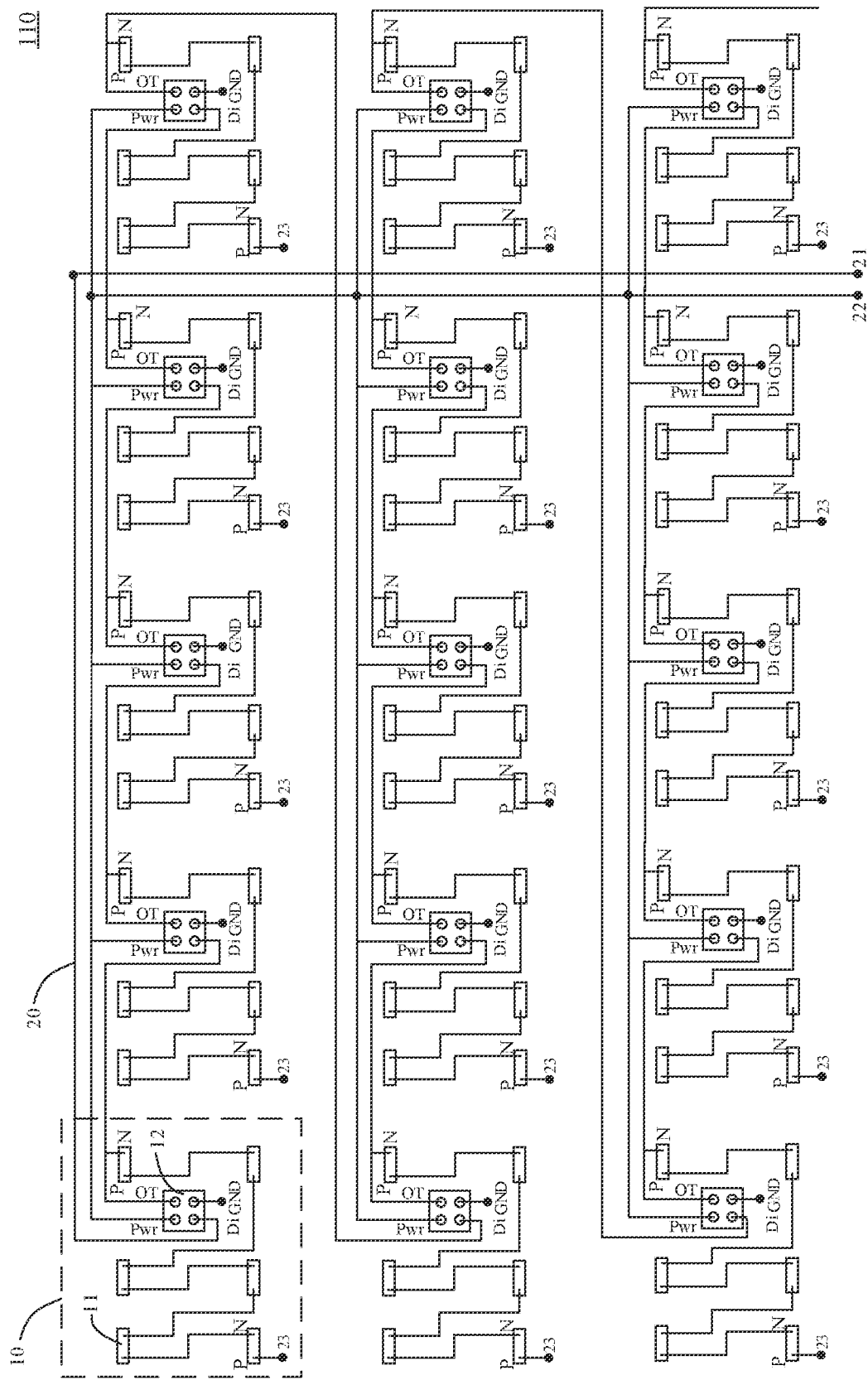
FIG. 3 is a circuit diagram of a light-emitting substrate, in accordance with some embodiments.

As shown in FIG. 3, the light-emitting substrate 110 includes a plurality of light-emitting units 10 arranged in an array and a plurality of signal lines 20. Each light-emitting unit 10 includes a plurality of light-emitting devices 11 that are connected in series and/or parallel, and at least one driving chip 12, and the at least one driving chip 12 is configured to drive the plurality of light-emitting devices 11 to emit light.

For example, as shown in FIG. 3, each light-emitting unit 10 includes six light-emitting devices 11 sequentially connected in series and one driving chip 12. Of course, each light-emitting unit 10 may also include four, five, seven or eight light-emitting devices 11, and a connection manner of the plurality of light emitting devices 11 in the light-emitting unit 10 is not limited to a series connection, but may also be a parallel connection. The embodiments of the present disclosure are not limited thereto.

In some embodiments, the backlight module 100 may use a tiny-LED backlight source, that is, the light-emitting device 11 of the light-emitting substrate 110 included in the backlight module 100 may be a tiny LED. The tiny LED includes a micro light-emitting diode (micro LED) and a mini light-emitting diode (mini LED). Here, a size (e.g., a length) of the micro LED is less than 50 microns, for example, in a range of 10 microns to 50 microns; and a size (e.g., a length) of the mini LED is in a range of 50 microns to 150 microns, for example, in a range of 80 microns to 120 microns.

Figure 4:
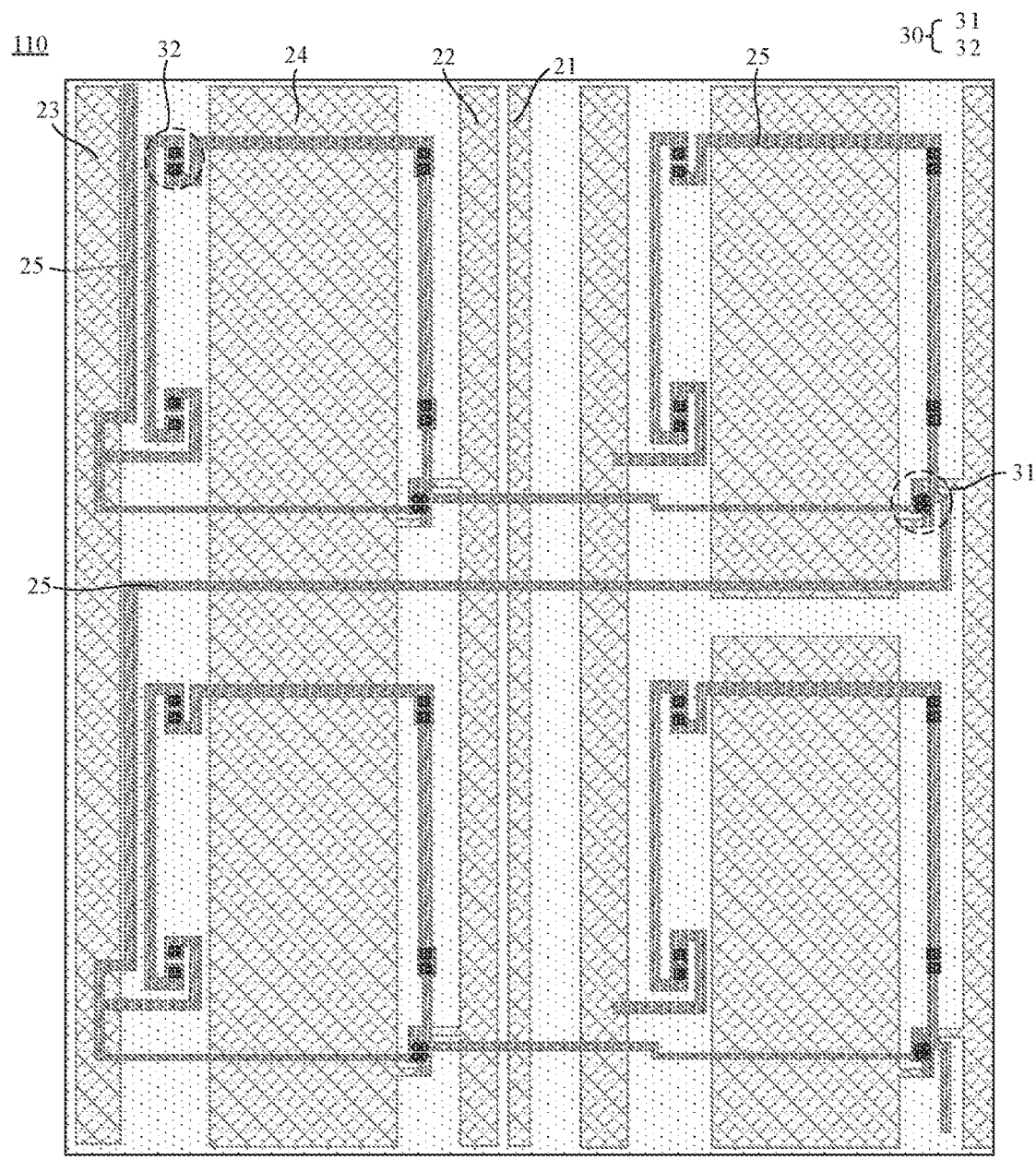
FIG. 4 is a structural diagram of a light-emitting substrate, in accordance with some embodiments.

As shown in FIGS. 3 and 4, the light-emitting substrate 110 further includes a plurality of pad groups 30 including at least one driving pad group 31 and at least one light-emitting device pad group 32. The light-emitting device 11 is connected to the light-emitting device pad group 32, and the driving chip 12 is connected to the driving pad group 31.

Figure 6:
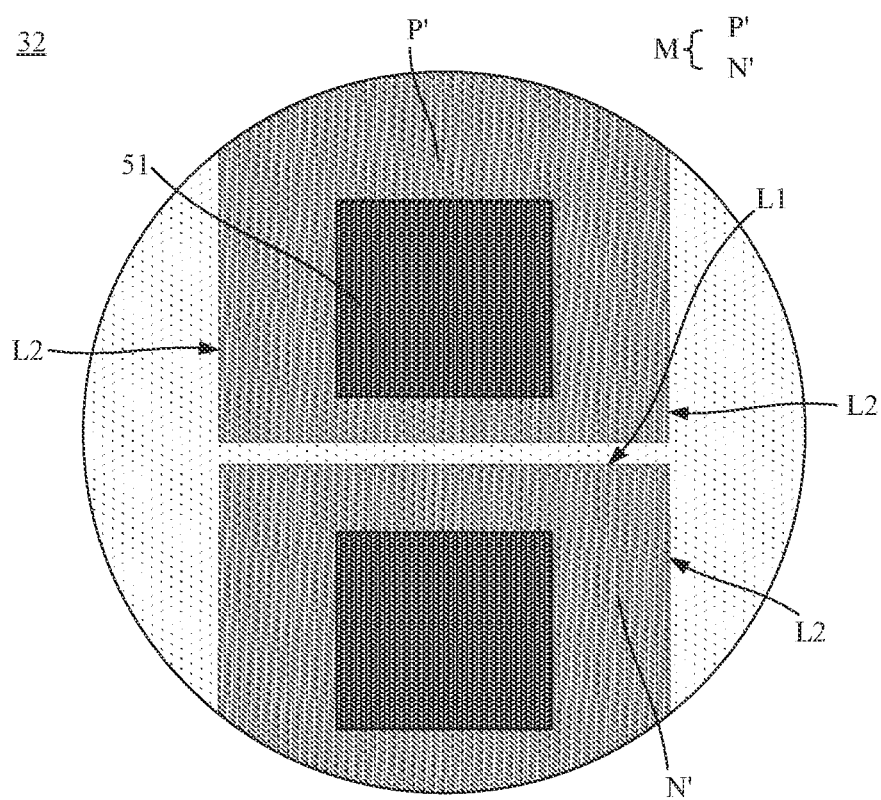
FIG. 6 is a partially enlarged view of a light-emitting device pad group of a light-emitting substrate, in accordance with some embodiments.

For example, as shown in FIGS. 3, 4 and 6, the light-emitting device 11 includes an anode pin P and a cathode pin N, and the light-emitting device pad group 32 includes an anode pad P' and a cathode pad N'. Here, the anode pad P' is configured to be connected to an anode of the light-emitting device 11, that is, the anode pad P' is connected to the anode pin P of the light-emitting device 11; and the cathode pad N' is configured to be connected to a cathode of the light-emitting device 11, that is, the cathode pad N' is connected to the cathode pin N of the light-emitting device 11.

Figure 5:
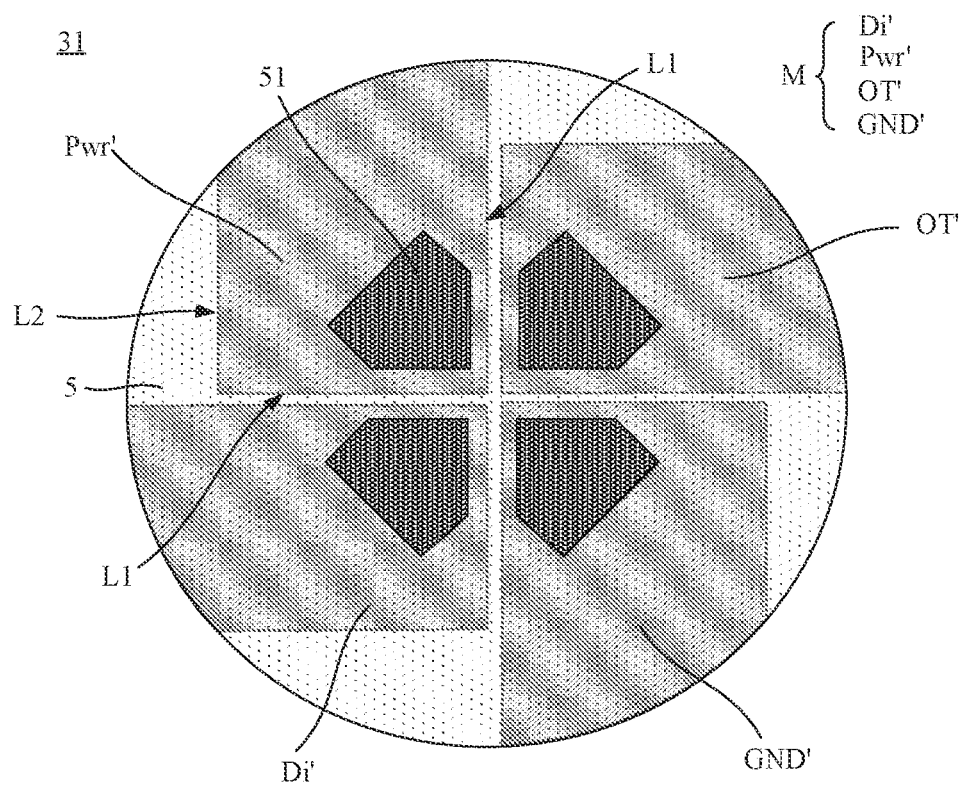
FIG. 5 is a partially enlarged view of a driving pad group of a light-emitting substrate, in accordance with some embodiments.

For example, as shown in FIGS. 3, 4 and 5, the driving chip 12 includes a first pin Di, a second pin Pwr, a third pin OT and a fourth pin GND, and the driving pad group 31 includes a first pad Di', a second pad Pwr', a third pad OT' and a fourth pad GND'. Here, the first pad Di' is configured to be connected to the first pin Di, the second pad Pwr' is configured to be connected to the second pin Pwr, the third pad OT' is configured to be connected to the third pin OT, and the fourth pad GND' is configured to be connected to the fourth pin GND.

The plurality of signal lines 20 include a source address line 21, a source voltage line 22, a driving voltage line 23 and a common voltage line 24.

As shown in FIGS. 3, 4 and 5, the source address line 21 is connected to the first pin Di of the driving chip 12 and is configured to transmit a first input signal, and the first input signal includes an address signal for gating a driving pad group 31 with a corresponding address. For example, different driving pad groups 31 may have the same or different addresses. The first input signal may be an 8-bit address signal, and an address to be transmitted may be obtained by parsing the address signal.

As shown in FIGS. 3, 4 and 5, the source voltage line 22 is connected to the second pin Pwr of the driving chip 12 and is configured to transmit a second input signal, and the second input signal includes a power supply signal for providing electric power for the driving chip 12 and/or a carrier communication signal for transmitting communication data to the driving chip 12. For example, the second input signal includes the power supply signal and the carrier communication signal, and the second input signal not only provides the electric power for the driving chip 12, but also transmits the communication data to the driving chip 12, where the communication data may be used to control a light-emitting duration of a corresponding light-emitting device 11, thereby controlling the light-emitting brightness of the light-emitting device in visual.

As shown in FIGS. 3, 4 and 5, the driving voltage line 23 is connected to the third pin OT of the driving chip 12, and the plurality of light-emitting devices 11 are disposed on a path where the driving voltage line 23 is connected to the third pin OT of the driving chip 12. The driving voltage line 23 is configured to transmit a driving voltage to drive the light-emitting device 11 to emit light. The third pin OT of the driving chip 12 may output an output signal, and the output signal includes a driving signal for driving the light-emitting device 11 to emit light and/or a relay signal used as the first input signal of another driving chip 12. For example, the output signal includes the driving signal and the relay signal; the driving signal is used for controlling the light-emitting device 11 to emit light, and the relay signal is used for providing an address signal for the another driving chip 12, that is, the relay signal may serve as the first input signal of the another driving chip 12.

As shown in FIGS. 3, 4 and 5, the common voltage line 24 is connected to the fourth pin GND of the driving chip 12 and is configured to transmit and receive a common voltage signal, which includes a ground signal.

It will be noted that the signal lines 20 may also include transitional connection lines 25. The connection of any of the source address line 21, the source voltage line 22, the driving voltage line 23 and the common voltage line 24 to the light-emitting device 11 and/or the driving chip 12 may be achieved through the transitional connection line 25. The embodiments of the present disclosure are not limited thereto.

Figure 9:
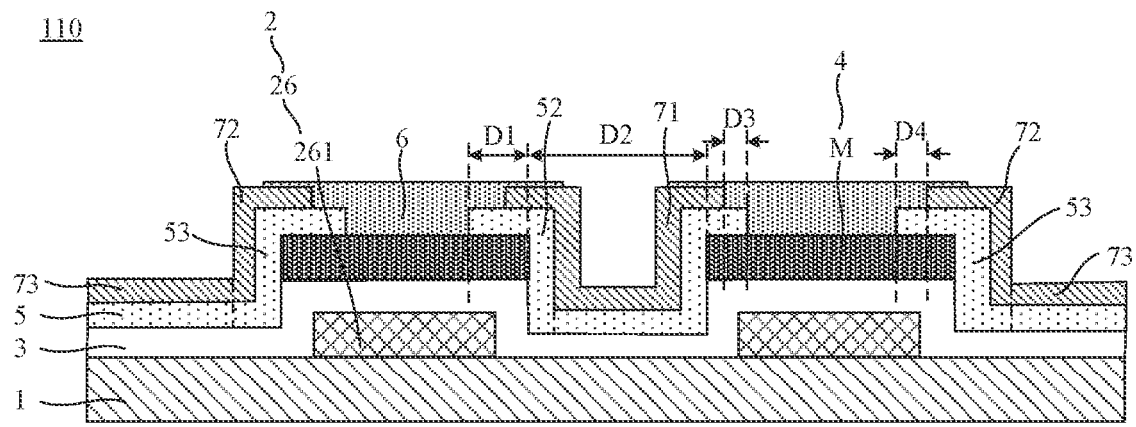
FIG. 9 is a sectional view taken along a section line A-A' in FIG. 7.
Figure 10:
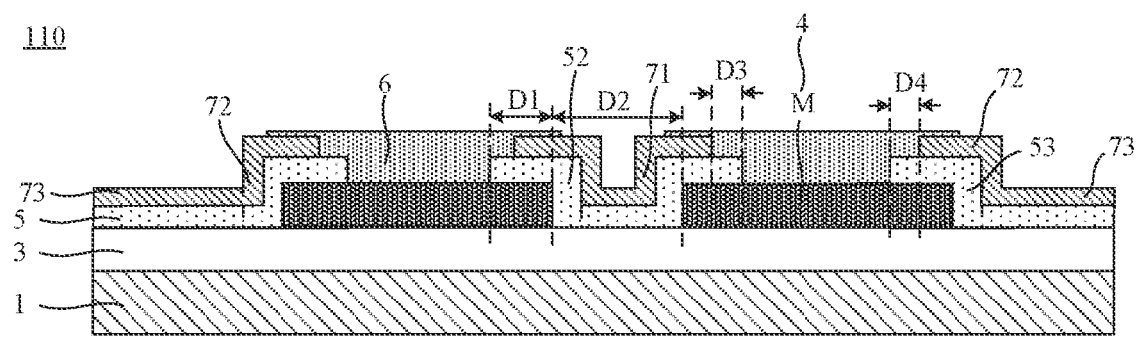
FIG. 10 is a sectional view taken along a section line A-A' in FIG. 8.

On this basis, referring to FIGS. 9 and 10, the light-emitting substrate 110 may include a substrate 1, and a second conductive layer 2, an insulating layer 3, a first conductive layer 4 and a passivation layer 5 that are sequentially stacked in a direction perpendicular to the passivation 1 and away from the passivation 1. With reference to FIG. 4, the source address line 21, the source voltage line 22, the driving voltage line 23 and the common voltage line 24 may be located in the second conductive layer 2, and the transitional connection lines 25 and the pad groups 30 may be located in the first conductive layer 4.

The passivation layer 5 is provided with openings 51 therein. As shown in FIGS. 5 to 8, the openings 51 are located on a side of pads M included in the pad group 30 away from the substrate 1, and there is a distance between an opening 51 and an edge of a pad M, that is, the opening 51 exposes at least a portion of the pad M to serve as a welding region. Thus, the passivation layer 5 needs to climb at the edge of the pad M, that is, the passivation layer 5 needs climb from a region around the pad M to an upper side of the pad M.

It will be noted that the shape of the opening 51 is not unique, and may be circular, polygonal or irregular. The embodiments of the present disclosure are not limited thereto. A pentagon is shown as an example in FIG. 5, and a rectangle is shown as an example in FIG. 6.

However, a climbing portion of the passivation layer 5 is prone to be broken, resulting in poor protection of the pad M and a low reliability. In addition, before an electroless nickle immersion gold (ENIG) process, in a process of tearing off a protective film attached on the light-emitting substrate 110, static electricity generated between the protective film and the passivation layer 5 may further damage the broken portion of the passivation layer 5, resulting in further detachment of the broken portion of the passivation layer. As a result, a conductive metal is formed at a position of the broken portion in the subsequent ENIG process, and the conductive metal may cause a short circuit between adjacent pads M, resulting in a reduction in product yield.

It will be noted that the ENIG process is to form a welding pattern 6 on a surface of the pad M away from the substrate 1, so that the light-emitting device 11 or the driving chip 12 is connected and fixed to the pads M in a pad group 30 corresponding thereto by means of welding.

Figure 7:
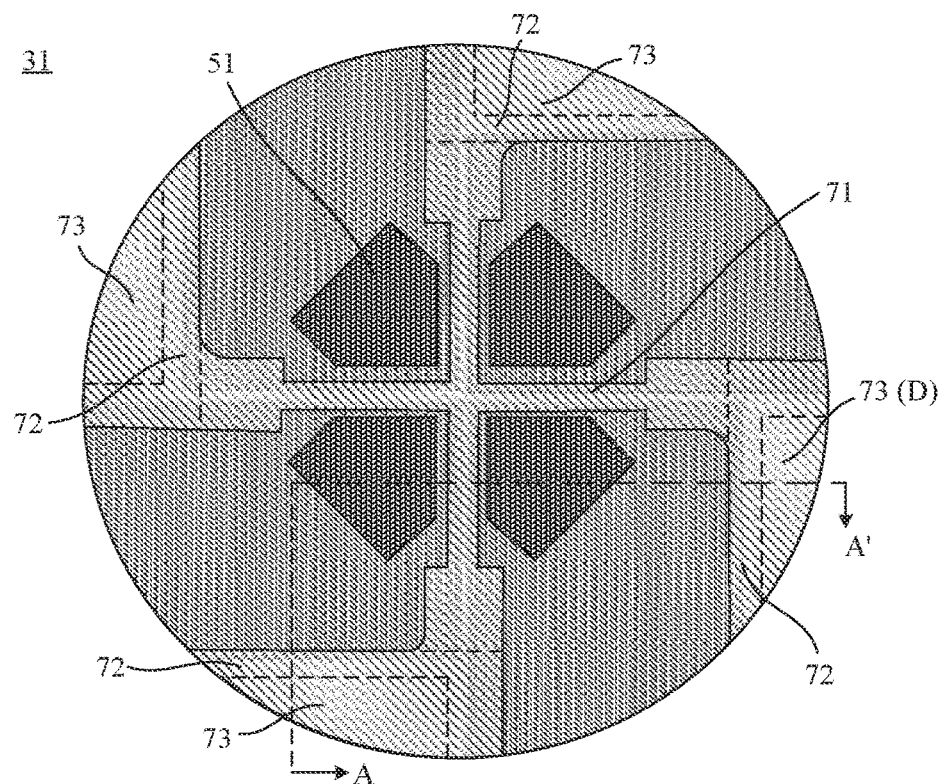
FIG. 7 is a partially enlarged view of a driving pad group, on which protective patterns are provided, of a light-emitting substrate, in accordance with some embodiments.
Figure 8:
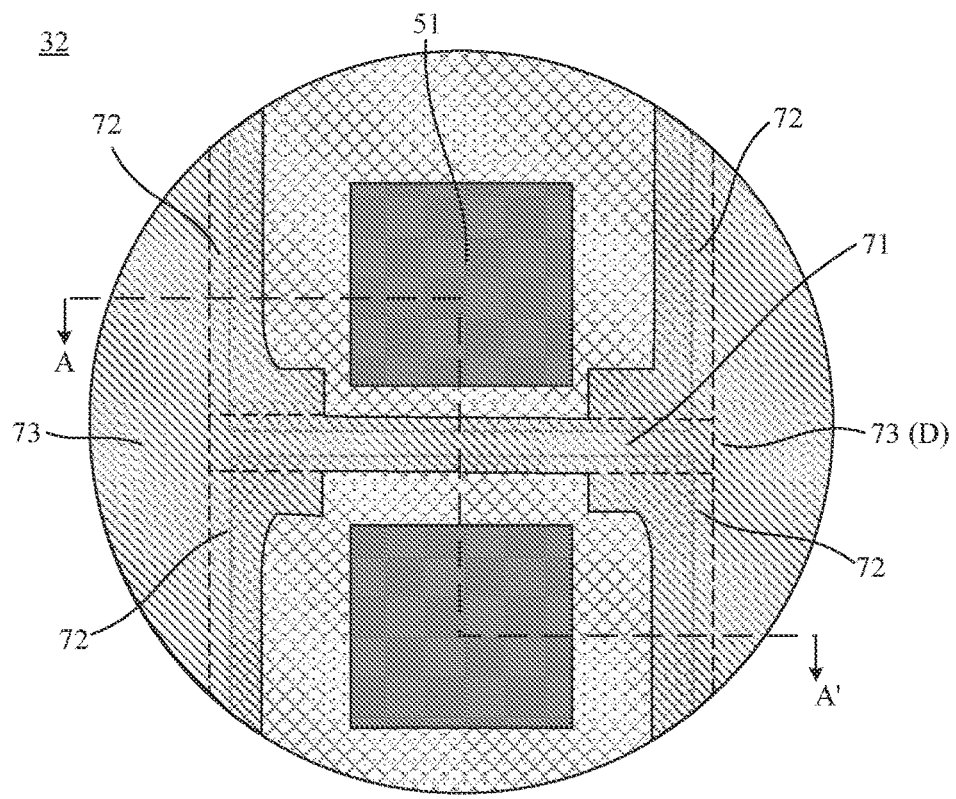
FIG. 8 is a partially enlarged view of a light-emitting device pad group, on which protective patterns are provided, of a light-emitting substrate, in accordance with some embodiments.

In order to solve the above problem, some embodiments of the present disclosure provide the light-emitting substrate 110. Referring to FIGS. 7 and 9, the light-emitting substrate 110 further includes a first protective pattern 71 disposed on a side of the passivation layer 5 away from the substrate 1.

Referring to FIGS. 9 and 10, the passivation layer 5 includes first climbing portions 52 and second climbing portions 53. The first climbing portion 52 covers a sidewall of a first edge L1 of the pad M, and the second climbing portion 53 covers a sidewall of a second edge L2 of the pad M. The first edge L1 is one of edges where the pads M in the pad group 30 are proximate to one another, and the second edge L2 is one of other edges of the pads M in the pad group 30.

On this basis, referring to FIGS. 7, 8, 9 and 10, the first protective pattern 71 covers the first climbing portion 52 and extends to a side of the passivation layer 5 away from the pad M. Here, there is a distance D3 between the first protective pattern 71 and the opening 51 to prevent the first protective pattern 71 from shielding the opening 51.

As will be seen from the above, the first protective pattern 71 is provided on the first climbing portion 52 of the passivation layer 5. In this case, after the first climbing portion 52 of the passivation layer 5 is broken, the first protective pattern 71 may still cover the broken portion, which may prevent the pad M from being exposed, thereby functioning as a protection to the pad M, and thus increasing reliability. Furthermore, the short circuit between adjacent pads M caused by the conductive metal formed at the broken portion in the ENIG process may be avoided, and thus the product yield may be improved.

In addition, since the first protective pattern 71 is provided between the first climbing portion 52 of the passivation layer 5 and the protective film, in the process of tearing off the protective film attached to the light-emitting substrate 110, the first climbing portion 52 of the passivation layer 5 will not generate static electricity of tearing, so that the first climbing portion 52 of the passivation layer 5 may be prevented from generating electrostatic damage. Moreover, the first climbing portion 52 of the passivation layer 5 may be prevented from being detached from the pad M caused by pulling by an adhesive force of the protection film. Thus, the product yield may be improved.

In some embodiments, as shown in FIGS. 9 and 10, the light-emitting substrate 110 further includes a second protective pattern 72 disposed on the surface of the passivation layer 5 away from the substrate 1.

Referring to FIGS. 7, 8, 9 and 10, the second protective pattern 72 covers the second climbing portion 53 and extends to the side of the passivation layer 5 away from the pad M. Here, there is a distance D4 between the second protective pattern 72 and the opening 51 to prevent the second protective pattern 72 from shielding the opening 51.

As will be seen from the above, the second protective pattern 72 is provided on the second climbing portion 53 of the passivation layer 5. In this case, after the second climbing portion 53 of the passivation layer 5 is broken, the second protective pattern 72 may still cover the broken portion, which may prevent the pad M from being exposed, thereby function as a protection to the pad M, and thus increasing the reliability. Furthermore, the short circuit between adjacent pads M caused by the conductive metal formed at the broken portion in the ENIG process may be avoided, and thus the product yield may be improved.

In addition, since the second protective pattern 72 is provided between the second climbing portion 53 of the passivation layer 5 and the protective film, in the process of tearing off the protective film attached to the light-emitting substrate 110, the second climbing portion 53 of the passivation layer 5 will not generate static electricity of tearing, so that the second climbing portion 53 of the passivation layer 5 may be prevented from generating electrostatic damage. Moreover, the second climbing portion 53 of the passivation layer 5 may be prevented from being detached from the pad M caused by pulling by the adhesive force of the protection film. Thus, the product yield may be improved.

In some embodiments, referring to FIGS. 7, 8, 9 and 10, the light-emitting substrate 110 further includes a third protective pattern 73 disposed on the surface of the passivation layer 5 away from the substrate 1.

The third protective pattern 73 covers a target region D, so as to protect a region of the light-emitting substrate 110 other than regions where the pad M, the first climbing portion 52 and the second climbing portion 53 are located. It will be noted that the target region is the region other than the regions where the pad M, the first climbing portion 52 and the second climbing portion 53 are located.

It can be understood that, in order to enhance the light exit efficiency of the light-emitting substrate 110, the first protective pattern 71, the second protective pattern 72 and the third protective pattern 73 may each be made of a material with high reflectivity, so as to reflect both the light emitted to the light-emitting substrate 110 by the light-emitting device 11 and the light reflected by the display panel 200 to the display panel 200, thereby enhancing the light exit efficiency of the display device 1000.

For example, the reflectivity of the first protective pattern 71 is greater than or equal to 80%. Here, a material of the first protective pattern 71 may include a photosensitive white ink or a non-photosensitive white ink. It will be noted that the photosensitive white ink refers to a white ink material that may undergo a chemical change after exposure and can be patterned after undergoing an appropriate development and etching treatment, that is, a material can be patterned through a photolithography process; and the non-photosensitive white ink refers to a white ink material that will not undergo a chemical change after exposure and cannot be patterned through the photolithography process.

For example, the reflectivity of the second protective pattern 72 is greater than or equal to 80%. Here, a material of the second protective pattern 72 may include a photosensitive white ink or a non-photosensitive white ink. It will be noted that, as for the photosensitive white ink and the non-photosensitive white ink, reference may be made to the above description, and details will not be repeated here in the embodiments of the present disclosure.

For example, the reflectivity of the third protective pattern 73 is greater than or equal to 80%. Here, a material of the third protective pattern 73 may include a photosensitive white ink or a non-photosensitive white ink. It will be noted that, as for the photosensitive white ink and the non-photosensitive white ink, reference may be made to the above description, and details will not be repeated here in the embodiments of the present disclosure.

It can be understood that the first protective pattern 71, the second protective pattern 72 and the third protective pattern 73 may be formed in the same process or may be respectively formed in different processes.

For example, the first protective pattern 71, the second protective pattern 72 and the third protective pattern 73 are formed directly through a single photolithography process or screen printing process. For another example, the first protective pattern 71 and the second protective pattern 72 are formed through a photolithography process or screen printing process, and the third protective pattern 73 is formed through another photolithography process or screen printing process. For yet another example, the first protective pattern 71 is formed through a photolithography process or screen printing process, the second protective pattern 72 is formed through another photolithography process or screen printing process, and the third protective pattern 73 is formed through yet another photolithography process or screen printing process. The embodiments of the present disclosure do not limit this.

In a case where the first protective pattern 71, the second protective pattern 72 and the third protective pattern 73 are formed directly through the single photolithography process or screen printing process, the first protective pattern 71, the second protective pattern 72 and the third protective pattern 73 are made of the same material and disposed in the same layer. In this case, the process is simple and the cost is low.

The following is illustrated by considering an example in which the first protective pattern 71, the second protective pattern 72 and the third protective pattern 73 are formed directly through the single photolithography process or screen printing process, and the embodiments of the present disclosure are not limited thereto.

In order to make the first protective pattern 71 cover the first climbing portion 52 and extend to the side of the passivation layer 5 away from the pad M, and make the distance formed between the first protective pattern 71 and the opening 51, a minimum distance between the opening 51 and the first edge L1 of the pad M varies according to different fabrication processes.

Furthermore, in order to make the second protective pattern 72 cover the second climbing portion 53 and extend to the side of the passivation layer 5 away from the pad M, and make the distance formed between the second protective pattern 72 and the opening 51, a minimum distance between the opening 51 and the second edge L2 of the pad M varies according to different fabrication processes.

In summary, the minimum distance between the opening 51 and the edge of the pad M varies according to different fabrication processes.

The first protective pattern 71, the second protective pattern 72 and the third protective pattern 73 may each be formed by using a photolithography process or screen printing process. Here, the photolithography process has an accuracy of 9 µm, and the screen printing process has an accuracy of 0.1 mm.

Based on this, referring to FIGS. 9 and 10, in a case where a minimum distance D1 between an edge of the opening 51 and the edge of the pad M is greater than or equal to 18 µm and less than 0.2 mm, the first protective pattern 71, the second protective pattern 72 and the third protective pattern 73 may be formed by using the photolithography process. In this case, the materials of the first protective pattern 71, the second protective pattern 72 and the third protective pattern 73 include a photosensitive material, for example, a photosensitive white ink. The embodiments of the present disclosure are not limited thereto.

For example, in the light-emitting substrate 110 of 75 inches, the opening 51 is of a pentagon, and the opening 51 is closest to the first edge L1 of the pad M, and a distance therebetween is 27 µm. The distance between the first protective pattern 71 and the opening 51 is 15 µm, and the distance between the first protective pattern 71 and the first edge L1 of the pad M is 12 µm. That is, the distance between the first protective pattern 71 and the opening 51 and the distance between the first protective pattern 71 and the first edge L1 of the pad M are both greater than 9 µm, which meets the accuracy requirements of the photolithography process.

Referring to FIGS. 9 and 10, in a case where the minimum distance D1 between the edge of the opening 51 and the edge of the pad M is greater than or equal to 0.2 mm, the first protective pattern 71, the second protective pattern 72 and the third protective pattern 73 may also be formed by using the screen printing process. In this case, the materials of the first protective pattern 71, the second protective pattern 72 and the third protective pattern 73 include a non-photosensitive material, for example, a non-photosensitive white ink. The embodiments of the present disclosure are not limited thereto.

The increase in the distance between the edge of the opening 51 and the edge of the pad M may be achieved by increasing an area of the pad M. For example, the distance between the edge of the opening 51 and the first edge L1 of the pad M is closest, and the distance between the edge of the opening 51 and the first edge L1 of the pad M needs to be increased to meet the accuracy requirements of the process. In this case, the area of the pad M may increase, that is, a distance between first edges L1 of the pads M in the pad group 30 may decrease. In this way, it is not necessary to change positions of the openings 51 corresponding to the pads M in the pad group 30, and it is not necessary to change the size of the driving chip 12 connected to the pads M at the openings 51. That is, it is possible to increase the distance between the edge of the opening 51 and the edge of the pad M without changing the size of the driving chip 12 or the light-emitting device 11, thereby reducing the process difficulty in fabricating the first protective pattern 71 and the second protective pattern 72 and reducing the cost.

It will be noted that referring to FIGS. 9 and 10, in a process of reducing a distance D2 between the first edges L1 of the pads M in the pad group 30, the distance D2 between the first edges L1 of the pads M in each pad group 30 is greater than or equal to 10 µm, so as to avoid the short circuit between two adjacent pads M during formation of the pads M in the pad group 30.

In some embodiments, referring to FIG. 9, the second conductive layer 2 further includes a plurality of support patterns 26. An orthogonal projection of each driving pad group 31 on the substrate 1 is at least partially overlapped with an orthogonal projection of a support pattern 26 on the substrate 1, so as to function to reduce a step difference between the pads M in the driving pad group 31, and reduce the difficulty of subsequent processes. It will be noted that the support patterns 26 are electrically insulated from the signal lines 20.

On this basis, each support pattern 26 may include four support plates 261 separated from one another. In each driving pad group 31, the four support plates 261 are respectively disposed on a side of the first pad Di', the second pad Pwr', the third pad OT' and the fourth pad GND' proximate to the substrate 1, and an orthogonal projection of the opening 51 on the substrate 1 is within an orthogonal projection of a support plate 261 on the substrate 1. With such an arrangement, when the pad M in the driving pad group 31 is used as a test point and is pierced, the pad M at the test point is not short-circuited at the pierced site, and thus the reliability may be rather high.

In some embodiments, referring to FIGS. 9 and 10, the light-emitting substrate 110 further includes a welding pattern 6 disposed on a surface of the first conductive layer 4 away from the substrate 1 and covering at least the opening 51. That is, the welding pattern 6 is located on the surface of the pads M away from the substrate 1, so that the light-emitting device 11 or the driving chip 12 is connected and fixed to the pads M in a pad group 30 corresponding thereto by means of welding.

Figure 11:
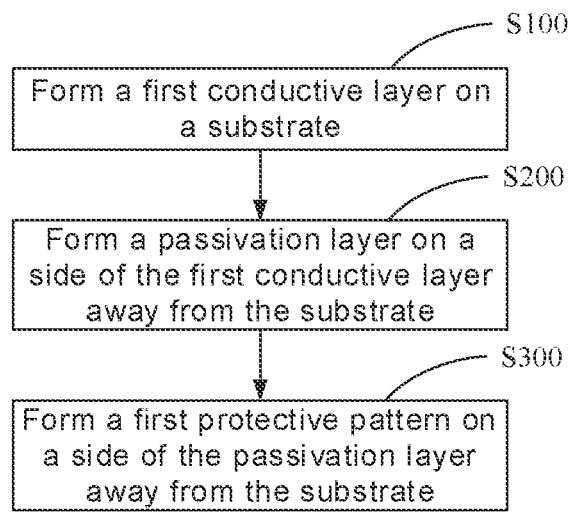
FIGS. 11 to 13 are flowcharts of a method for manufacturing a light-emitting substrate, in accordance with some embodiments.

Some embodiments of the present disclosure further provide a method for manufacturing a light-emitting substrate. Referring to FIG. 11, the method for manufacturing the light-emitting substrate includes S100 to S300.

In S100, a first conductive layer 4 is formed on a substrate 1.

In the above step, the first conductive layer 4 includes a plurality of pad groups 30, and each pad group 30 includes a plurality of pads M.

The process method for forming the first conductive layer 4 on the substrate 1 is not unique. For example, a first conductive film is formed on the substrate 1 by means of coating or chemical deposition, and the first conductive film is exposed by mask, developed and etched to form the plurality of pad groups 30.

In S200, a passivation layer 5 is formed on a side of the first conductive layer 4 away from the substrate 1.

In the above step, the passivation layer 5 is provided with a plurality of openings 51 therein, an opening 51 is located on a side of a pad M away from the substrate 1, and there is a distance between the opening and an edge of the pad M. The passivation layer 5 includes first climbing portions 52 and second climbing portions 53. A first climbing portion 52 covers a sidewall of a first edge L1 of the pad M, and a second climbing portion 53 covers a sidewall of a second edge L2 of the pad M. The first edge L1 is one of edges where the plurality of pads M in the pad group 30 are proximate to one another, and the second edge L2 is one of other edges of the plurality of pads M in the pad group 30.

The process method for forming the passivation layer 5 on the substrate 1 is not unique. For example, a passivation film is formed on the substrate 1 by means of coating or chemical deposition, and the passivation film is exposed by mask, developed and etched to form the plurality of openings 51.

In S300, a first protective pattern 71 is formed on a side of the passivation layer 5 away from the substrate 1.

In the above step, the first protective pattern 71 covers the first climbing portion 52 and extends to a side of the passivation layer 5 away from the pad M, and there is a distance between the first protective pattern 71 and the opening 51.

Figure 12:
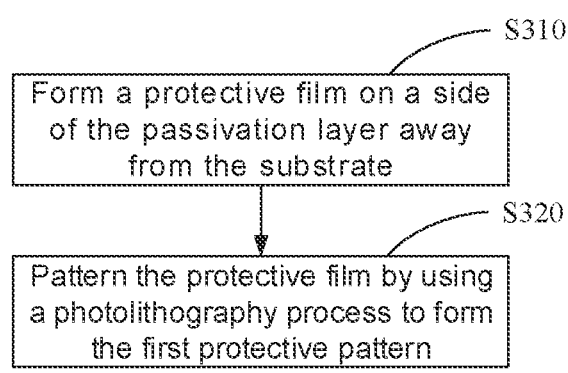

In a case where a minimum distance between an edge of the opening 51 and the edge of the pad M is greater than or equal to 18 μm and less than 0.2 mm, referring to FIG. 12, the S300 may include S310 to S320.

In S310, a protective film is formed on the side of the passivation layer 5 away from the substrate 1.

In the above step, the protective film may be formed by means of coating or chemical deposition. A material of the protective film may be a photosensitive material, for example, a photosensitive white ink.

In S320, the protective film is patterned by using a photolithography process to form the first protective pattern 71.

In the above step, the photolithography process is to expose by mask, develop and etch, so as to form the first protective pattern 71.

Figure 13:
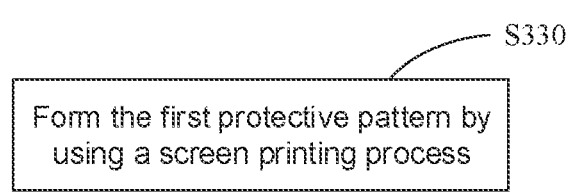

In a case where the minimum distance between the edge of the opening 51 and the edge of the pad M is greater than or equal to 0.2 mm, referring to FIG. 13, the S300 may include S330.

In S330, the first protective pattern 71 is formed by using a screen printing process.

In some embodiments, a second protective pattern 72 may be formed synchronously in the process of S300. The second protective pattern 72 covers the second climbing portion 53 and extends to the side of the passivation layer 5 away from the pad M, and there is a distance between the second protective pattern 72 and the opening 51.

In some embodiments, a third protective pattern 73 may also be formed synchronously in the process of S300. The third protective pattern 73 covers a target region, which is a region other than regions where the pad M, the first climbing portion 52 and the second climbing portion 53 are located.

The above descriptions are merely specific implementation manners of the present disclosure, but the protection scope of the present disclosure is not limited thereto. Changes or replacements that any person skilled in the art could conceive of within the technical scope of the present disclosure shall all be included in the protection scope of the present disclosure. Therefore, the protection scope of the present disclosure shall be subject to the protection scope of the claims.

What is claimed is:

1. A light-emitting substrate, comprising:
a substrate;
a first conductive layer disposed on a side of the substrate, wherein the first conductive layer includes a plurality of pad groups, and each pad group includes a plurality of pads;
a passivation layer disposed on a side of the first conductive layer away from the substrate, wherein the passivation layer is provided with a plurality of openings therein, an opening is located on a side of a pad away from the substrate, and the opening and an edge of the pad have a distance therebetween; the passivation layer includes a first climbing portion and a second climbing portion, the first climbing portion covers a sidewall of a first edge of the pad, and the second climbing portion covers a sidewall of a second edge of the pad; and the first edge is one of edges where the plurality of pads in the pad group are proximate to one another, and the second edge is one of other edges of the plurality of pads in the pad group; and
a first protective pattern disposed on a surface of the passivation layer away from the substrate, wherein the first protective pattern covers the first climbing portion and extends to a side of the passivation layer away from the pad, and the first protective pattern and the opening have a distance therebetween.

2. The light-emitting substrate according to claim 1, further comprising:
a second protective pattern disposed on the surface of the passivation layer away from the substrate, wherein the second protective pattern covers the second climbing portion and extends to the side of the passivation layer away from the pad, and the second protective pattern and the opening have another distance therebetween.

3. The light-emitting substrate according to claim 1, further comprising:
a third protective pattern disposed on the surface of the passivation layer away from the substrate and covering a target region, wherein the target region is a region other than regions where the plurality of pads, the first climbing portion and the second climbing portion are located.

4. The light-emitting substrate according to claim 1, wherein reflectivity of the first protective pattern is greater than or equal to 80%;
the light-emitting substrate further comprises a second protective pattern disposed on the surface of the passivation layer away from the substrate, wherein the second protective pattern covers the second climbing portion and extends to the side of the passivation layer away from the pad, the second protective pattern and the opening have another distance therebetween, and reflectivity of the second protective pattern is greater than or equal to 80%; and
the light-emitting substrate further comprises a third protective pattern disposed on the surface of the passivation layer away from the substrate and covering a large region, wherein the target region is a region other than regions where the plurality of pads, the first climbing portion and the second climbing portion are located, and reflectivity of the third protective pattern is greater than or equal to 80%.

5. The light-emitting substrate according to claim 1, wherein a minimum distance between an edge of the opening and the edge of the pad is greater than or equal to 18 μm and less than 0.2 mm; or
the minimum distance between the edge of the opening and the edge of the pad is greater than or equal to 0.2 mm.

6. The light-emitting substrate according to claim 5, wherein in a case where the minimum distance between the edge of the opening and the edge of the pad is greater than or equal to 18 μm and less than 0.2 mm, a material of the first protective pattern includes a photosensitive white ink; or
in a case where the minimum distance between the edge of the opening and the edge of the pad is greater than or equal to 0.2 mm, the material of the first protective pattern includes a non-photosensitive white ink.

7. The light-emitting substrate according to claim 1, further comprising a second protective pattern disposed on the surface of the passivation layer away from the substrate and covering the second climbing portion, and a third protective pattern disposed on the surface of the passivation layer away from the substrate and covering a target region, wherein the first protective pattern, the second protective pattern and the third protective pattern are made of the same material and disposed in the same layer.

8. The light-emitting substrate according to claim 1, wherein the plurality of pad groups include a driving pad group, and the driving pad group includes:
 a first pad configured to be connected to a first pin of a driving chip;
 a second pad configured to be connected to a second pin of the driving chip;
 a third pad configured to be connected to a third pin of the driving chip; and
 a fourth pad configured to be connected to a fourth pin of the driving chip.

9. The light-emitting substrate according to claim 8, further comprising:
 a second conductive layer disposed between the first conductive layer and the substrate, wherein the second conductive layer includes a plurality of support patterns, and an orthogonal projection of each driving pad group on the substrate is at least partially overlapped with an orthogonal projection of a support pattern on the substrate; and
 an insulating layer disposed between the second conductive layer and the first conductive layer.

10. The light-emitting substrate according to claim 9, wherein each support pattern includes four support plates separated from one another; and
 the four support plates are respectively disposed on a side of the first pad, the second pad, the third pad and the fourth pad, proximate to the substrate, in each driving pad group, and an orthogonal projection of the opening on the substrate is within an orthogonal projection of a support plate on the substrate.

11. The light-emitting substrate according to claim 1, wherein the plurality of pad groups include a light-emitting device pad group, and the light-emitting device pad group includes:
 an anode pad configured to be connected to an anode of a light-emitting device; and
 a cathode pad configured to be connected to a cathode of the light-emitting device.

12. The light-emitting substrate according to claim 1, wherein a distance between first edges of the plurality of pads in each pad group is greater than or equal to 10 μm.

13. The light-emitting substrate according to claim 1, further comprising:
 a welding pattern disposed on a surface of the first conductive layer away from the substrate and covering at least the opening.

14. A method for manufacturing a light-emitting substrate, the method comprising:
 forming a first conductive layer on a substrate, wherein the first conductive layer includes a plurality of pad groups, and each pad group includes a plurality of pads;
 forming a passivation layer on a side of the first conductive layer away from the substrate, wherein the passivation layer is provided with a plurality of openings therein, an opening is located on a side of a pad away from the substrate, and the opening and an edge of the pad have a distance therebetween; the passivation layer includes a first climbing portion and a second climbing portion, the first climbing portion covers a sidewall of a first edge of the pad, and the second climbing portion covers a sidewall of a second edge of the pad; and the first edge is one of edges where the plurality of pads in the pad group are proximate to one another, and the second edge is one of other edges of the plurality of pads in the pad group; and
 forming a first protective pattern on a side of the passivation layer away from the substrate, wherein the first protective pattern covers the first climbing portion and extends to a side of the passivation layer away from the pad, and the first protective pattern and the opening have a distance therebetween.

15. The method according to claim 14, further comprising:
 forming a second protective pattern synchronously in a process of forming the first protective pattern on the side of the passivation layer away from the substrate;
 wherein the second protective pattern covers the second climbing portion and extends to the side of the passivation layer away from the pad, and the second protective pattern and the opening have another distance therebetween.

16. The method according to claim 14, further comprising
 forming a third protective pattern synchronously in a process of forming the first protective pattern on the side of the passivation layer away from the substrate, wherein the third protective pattern covers a target region, and the target region is a region other than regions where the plurality of pads, the first climbing portion and the second climbing portion are located.

17. The method according to claim 14, wherein a minimum distance between an edge of the opening and the edge of the pad is greater than or equal to 18 μm and less than 0.2 mm; and
 forming the first protective pattern on the side of the passivation layer away from the substrate includes:
 forming a protective film on the side of the passivation layer away from the substrate; and
 patterning the protective film by using a photolithography process to form the first protective pattern.

18. The method according to claim 14, wherein a minimum distance between an edge of the opening and the edge of the pad is greater than or equal to 0.2 mm; and
 forming the first protective pattern on the side of the passivation layer away from the substrate includes:
 forming the first protective pattern by using a screen printing process.

19. A backlight module, comprising:
a light-emitting substrate, wherein the light-emitting substrate is the light-emitting substrate according to claim 1.

20. A display device, comprising:
a display panel; and
the backlight module according to claim 19, and the backlight module being disposed on a backlight surface of the display panel.

* * * * *